United States Patent [19]

Tunzi

[11] 4,068,178
[45] Jan. 10, 1978

[54] VARIABLE FREQUENCY WAVEFORM SYNTHESIZER

[75] Inventor: Burton Ralph Tunzi, Santa Clara, Calif.

[73] Assignee: Telenetics, Inc., Newport Beach, Calif.

[21] Appl. No.: 728,745

[22] Filed: Oct. 1, 1976

[51] Int. Cl.² .......................................... H03B 19/00
[52] U.S. Cl. ................................. 328/14; 364/718; 328/48; 340/347 DA
[58] Field of Search ............................. 328/14, 25, 48; 307/271; 331/51, 56; 340/347 DA; 235/197, 150.53

[56] References Cited

U.S. PATENT DOCUMENTS

| | | | |
|---|---|---|---|
| 3,719,897 | 3/1973 | Tarr | 331/51 |
| 3,787,836 | 1/1974 | Hagelbarger | 328/14 X |
| 3,952,189 | 4/1976 | Fabricius | 235/197 |

Primary Examiner—Siegfried H. Grimm
Attorney, Agent, or Firm—Fraser and Bogucki

[57] ABSTRACT

A variable frequency waveform synthesizer includes a programmable counter coupled to count cycles of a single reference clock signal and recycle at an intermediate frequency determined by a count number selected in response to frequency selection signals. Because of the need to select an integral count number, a count number that is exactly required for a desired frequency must be rounded off to the nearest integral number and the higher the number the lower the percent round off error. Thus, the percentage frequency error for a plurality of different waveforms that are synthesized as a sequence of discrete steps derived from a common reference clock signal is reduced by dividing the reference frequency to obtain an intermediate frequency signal and dividing each period of the intermediate frequency signal into a plurality of not necessarily equal steps to obtain a stepping signal commanding step changes in the synthesized waveform. The stepping signal is thus exactly periodic at the intermediate frequency and approximately periodic at the higher stepping frequency while the resulting synthesized waveform has a reduced percentage frequency error and only a small harmonic distortion.

18 Claims, 2 Drawing Figures

VARIABLE FREQUENCY WAVEFORM SYNTHESIZER

CROSS REFERENCE TO RELATED APPLICATION

This application relates to a portion of a patent application, DTMF Communication System, by Hayes et al, Ser. No. 728,725, filed simultaneously herewith. A more complete understanding of the system to which the portion described herein relates may be had by reference to the relation application.

BACKGROUND OF THE INVENTION

1. Field of the Invention

This invention relates to a digital waveform synthesizer and more particularly to a synthesizer generating a waveform at a plurality of different frequencies from a single clock signal.

2. Description of the Prior Art

When a periodic waveform is synthesized as a plurality of discrete steps derived by repetitively counting a high frequency clock signal, the number of counts must be an integral number and the percentage error in the frequency of the synthesized waveform is reduced by increasing the count number. Thus, rounding a required count number of 50.5 to 50 produces a 1% error while rounding a required count number of 100.5 to 100 produces only a 0.5% error. The count number can be increased by increasing the clock signal frequency or decreasing the number of steps in one cycle of a synthesized waveform. However, practical restraints limit these parameters. Therefore, better frequency accuracy has heretofore required higher frequency counting circuits or lower quality synthesized waveforms.

SUMMARY OF THE INVENTION

A waveform synthesizer in accordance with the invention includes a clock signal generator providing a reference signal at a known frequency, a counter circuit connected to count cycles of the reference signal and to recycle after a number of counts at an intermediate frequency less than a desired stepping frequency, a decoder coupled to sense count states of the counter circuit and generate a plurality of step increment signals for each cycle of the counter, and a waveform generating circuit coupled to generate a periodic waveform as a sequence of discrete steps occurring at the stepping frequency, the waveform generating circuit being incremented from step to step in response to the step increment signals.

The total variation in time duration between the successive step increment signals is preferably less than 15% to avoid substantial distortion of the synthesized waveform. As few as four steps for each cycle of the intermediate frequency signal may substantially reduce the frequency error where waveforms at several different frequencies must be synthesized from a single reference clock signal. A waveform such as a sinewave may thus be synthesized at a plurality of frequencies from a single practical frequency base with both good frequency accuracy and low harmonic distortion.

BRIEF DESCRIPTION OF THE DRAWINGS

A better understanding of the invention may be had from a consideration of the following detailed description, taken in conjunction with the accompanying drawings in which.

DETAILED DESCRIPTION

Figure 1:
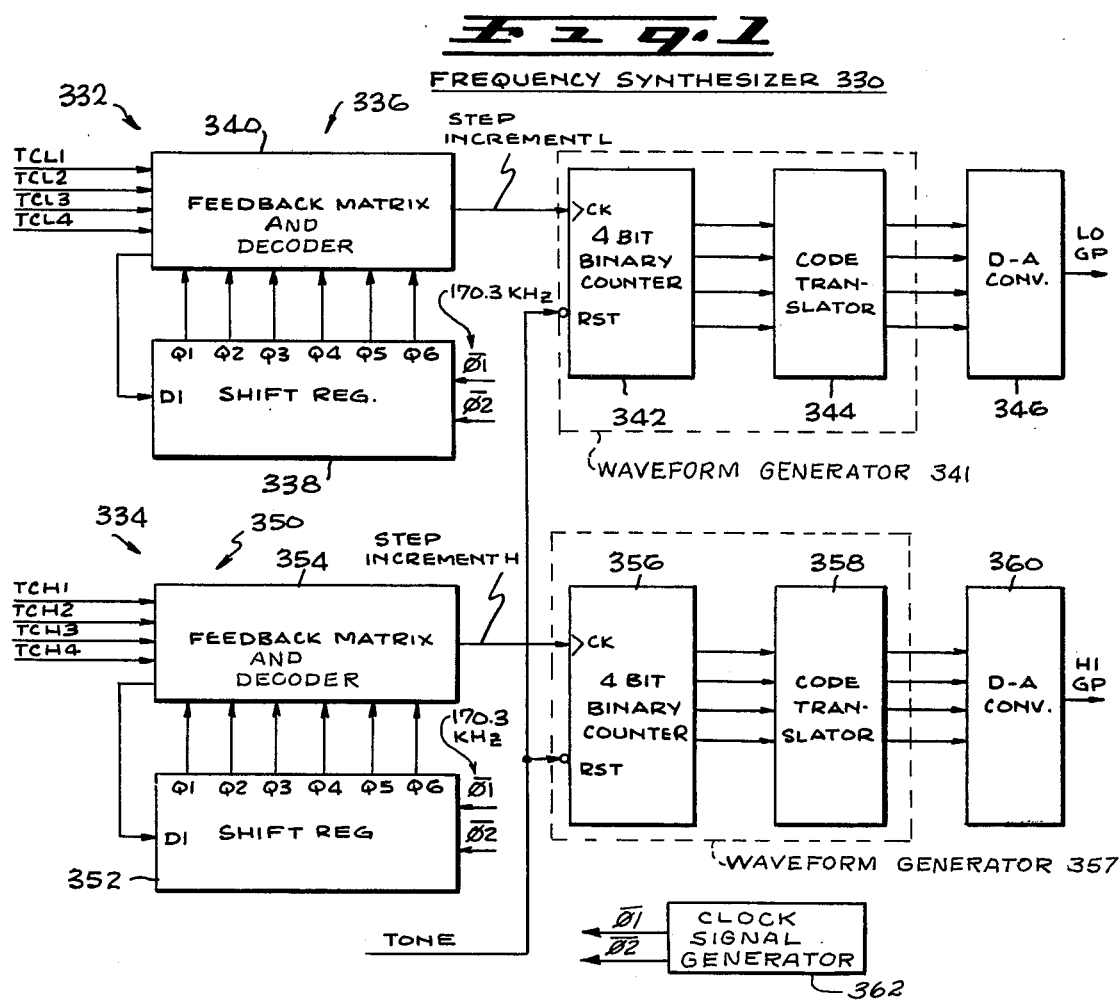
FIG. 1 is a block diagram representation of a waveform synthesizer in accordance with the invention.

Referring now to FIG. 1, a frequency synthesizer 330 includes a low frequency tone generator circuit 332 and a high frequency tone generator circuit 334. The low frequency tone generator circuit 332 includes a programmable counter 336 which is implemented in this example as a 6 bit shift register 338 and a feedback matrix and decoder 340 which controls the least significant bit or D1 input to shift register 338 to cause it to repeatedly sequence through a selected number of steps or counts as determined by low tone frequency select signals TCL1-TCL4. It should be appreciated, however, that while the programmable counter 336 has been implemented in a manner that is particularly advantageous for fabrication as a P MOS integrated circuit, in general programmable counter 336 may be any recycling counter having a selectable number of different sequential count states.

A waveform generator 341 includes a 4 bit binary counter 342 and a code translator 344. The 4 bit binary counter 342 has a clock input coupled to receive a signal STEP INCREMENT L from feedback matrix and decoder 340. Binary counter 342 divides each sine wave period into 16 discrete steps or intervals and is clocked by signal STEP INCREMENT L at a rate of approximately 16 times the desired DTMF (dual tone multiple frequency) at output LOGP tone frequency to cause counter 342 to sequence through one count cycle for each sine wave output cycle. Counter 342 has a complementing reset input connected to signal TONE and therefore is free to count repetitions of clock signal STEP INCREMENT L in the presence of a TONE signal but is constrained to a reset condition in the absence of a TONE signal. Signal TONE is a control signal which enables generator of sine wave outputs at LO GP and HI GP. A code translator 344 receives the 4 bit binary output from binary counter 342 and in response thereto generates a digital binary code output signal that is indicative of a desired sine wave magnitude for each of the 16 portions of a sine wave period defined by binary counter 342. A digital-to-analog converter 346 receives the digitally coded 4 bit binary sine wave magnitude signal from code translator 344 and converts this signal to an analog signal LO GP having an analog magnitude proportional to a binary count defined by the output of code translator 344. Signal LO GP becomes the low tone group frequency DTMF output signal for frequency synthesizer 330.

Except that different frequencies are involved, the high frequency tone generator circuit 334 is generally similar to low frequency tone generator circuit 332. High frequency tone generator circuit includes a programmable counter 350 including a 6 bit shift register 352 and a feedback matrix and decoder 354 responsive to the 6 outputs of shift register 352 and the high frequency group tone command signals TCH1-TCH4.

Feedback matrix and decoder 354 provides a STEP INCREMENT H signal at a frequency approximately 16 times a desired high tone group DTMF output frequency which increments a 4 bit binary counter 356 within a waveform generator 357 which also includes a code translator 358. Counter 356 is reset in the absence of signal TONE and is permitted to count only in the presence of signal TONE. The 4 binary outputs of counter 356 are coupled as inputs to a code translator 358 which is identical to code translator 344. Code translator 358 has 4 binary outputs which are coupled as inputs to a digital-to-analog converter 360 that may be identical to A-D converter 346. Digital-to-analog converter 360 provides an output signal HI GP that is the high group DTMF tone frequency output for frequency synthesizer 330.

Frequency synthesizer 330 divides each output sine wave period into a plurality of steps or intervals. Because a large harmonic noise signal is generated at the stepping frequency, the chosen number of step, N, must be sufficiently large that the lowest frequency times N must be greater than twice the highest frequency that is to be generated. This relationship permits the harmonic noise at the stepping frequency to be attenuated by a low pass filter. The attenuation capability increases with N and it is therefore desirable that N actually be substantially greater than the minimum.

In the present example, low group tones and high group tones are independently generated and can therefore be separately filtered, although two separate low pass filters would be required where only one would be required if the signals are combined before filtering. For the low group standard DTMF tones, the highest frequency is 946 Hz and the lowest frequency is 698 Hz. It is therefore necessary that N be greater than $2 \times 946/698 = 2.6$. Similarly, for separate filtering of the high group, N must be greater than $2 \times 1638/1217 = 2.7$. If the low group and high group DTMF signals are to be combined for filtering, then N must be greater than $2 \times 1638$ divided by $698 = 4.7$. In the present example, the number of steps has been selected to be 16. Actual tests showed that with N selected to be 16, the greatest harmonic noise occurred at the 14th and 16th harmonics. All lower harmonics were at least 45 DB below the magnitude of the fundamental sine wave frequency. The 14th harmonic was down 26 DB and the 16th harmonic was down approximately 28 DB. With a simple single pole RC filter, the 14th harmonic was reduced to approximately 45 DB below the fundamental and the 16th harmonic was reduced to approximately 48 DB below the fundamental. In each case, the lower frequency harmonics were below the 14th harmonic in magnitude.

Having selected the stepping frequency to be 16 times the fundamental output tone frequency, the problem arises of selecting a master clock frequency from which all of the output tone frequencies can be derived. Because a master clock frequency can practically be divided only by an integral number to provide the tone stepping frequencies, it is unlikely that a master clock frequency can be found that is an integral multiple of all of the tone stepping frequencies, except at an extremely high frequency that would be impractical to implement as an integrated circuit. However, the higher the master clock frequency, the smaller will be the percentage error in the fundamental output tone frequencies.

In the present example, a master clock frequency of 170.3 KHz has been selected for generation on differently phased signals $\overline{\phi 1}$ and $\overline{\phi 2}$ by a clock signal generator 362. To generate the highest DTMF frequency-stepping signal from this master clock frequency, it is necessary to divide the master clock frequency by a number $M = 170,300/1638 \times 16 = 6.53$. However, since the master clock frequency can be divided only by an integral number, the master clock frequency must be divided by either 6 or 7. If divided by 7, the actual fundamental frequency turns out to be 1520.5 for an error of 7.23%. On the other hand, if the diviser is selected to be 6, the fundamental frequency turns out to be 1773.96 Hz for an error of 8.3%. While this error can be reduced by increasing the master clock signal, such an increase will place constraints on the method of manufacture and yield of the frequency synthesizer 330.

However, this error may be reduced in accordance with the invention by utilizing an intermediate frequency which is an integral submultiple of the stepping frequency and also an integral submultiple of the master clock frequency. For example, an intermediate frequency of $\frac{1}{4}$ the stepping frequency or four times the fundamental output tone frequency has been selected for frequency synthesizer 330. For the highest tone of the high group, the intermediate frequency is therefore $4 \times 1638 = 6552$ Hz. Dividing the master clock frequency by the intermediate frequency produces a required diviser of $M = 25.99$ for zero error. Rounding this off to $M = 26$ produces negligible error in the actual DTMF output tone fundamental frequency.

However, the intermediate frequency is now derived by sequencing the programmable counter 350 through 26 different sequential count states. Because the intermediate frequency is only $\frac{1}{4}$ of the stepping frequency, these 26 count states must be further subdivided to provide 4 pulses on signal STEP INCREMENT H for each cycle of the 26 count states. Since the 26 count states are not integrally divisible by the number 4, the stepping pulses on signal STEP INCREMENT H cannot occur at exactly uniform periods. However, 4 stepping pulses can be derived for each 26 step sequence by alternately generating a stepping pulse after 6 count states and then 7 count states. These unequal periods will result in some harmonic distortion of the fundamental sine wave signal, but each $\frac{1}{4}$ sine wave period or 90° of phase repeatedly corresponds to exactly $\frac{1}{4}$ of the period of the actual output sine wave tone signal. Therefore, the noise from harmonic distortion is of relatively small magnitude and was found to be down more than 26 DB from the fundamental even without filtering. Furthermore, the worst case occurred with the 14th harmonic so that a single pole filter permitted the distortion to be reduced to more than 45 DB below the magnitude of the fundamental frequency signal.

In the absence of a tone command latch input signal, the feedback matrix and decoder 340 is connected to provide an output signal to register 338 input D1 of logic 1 when shift register 338 contains all 0's or when $Q5 \times Q6 = 1$. This arrangement causes the programmable counter 336 to sequence repeatedly through 63 different count states in the absence of a low tone command input signal TCL1-TCL4. However, in the event that one of the signals TCL1-TCL4 goes true, feedback matrix 340 provides an output signal which causes some of the sequencing states to be skipped to provide an actual integral number of sequence states M to provide a desired intermediate frequency for a selected tone frequency. In the present example, $M = 45$ for tone $L4 = 946$ Hz; $M = 50$ for tone $L3 = 851$ Hz; $M = 55$ for tone $L2 = 774$ Hz; and $M = 61$ for tone $L1 = 698$ Hz. The actual tone signals L1-L4 have been given as the standard tone signal frequencies and it will be appreciated that the frequencies of the signals actually generated will vary by an acceptable amount from standard frequencies. The required sequences are obtained by generating input signal D1 to shift register 338 with the logic function.

LOW GROUP $D1 = \overline{Q1} \cdot Q2 \cdot Q3 \cdot \overline{Q4} \cdot \overline{Q5} \cdot \overline{Q6} +$ $TCL1 \cdot Q1 \cdot \overline{Q2} \cdot Q3 \cdot \overline{Q4} \cdot Q5 \cdot Q6 +$ $TCL3 \cdot \overline{Q1} \cdot Q2 \cdot Q3 \cdot Q4 \cdot \overline{Q5} \cdot \overline{Q6} +$ $TCL4 \cdot Q1 \cdot Q2 \cdot \overline{Q3} \cdot Q4 \cdot \overline{Q5} \cdot \overline{Q6} +$ $\overline{TCL2 \cdot \overline{Q1} \cdot \overline{Q2} \cdot Q3 \cdot \overline{Q4} \cdot Q5 \cdot \overline{Q6} \cdot Q5 \cdot \overline{Q6} \cdot \overline{Q5} \cdot \overline{Q6}}$ Similarly, signal STEP INCREMENT L is derived by detecting different count states depending upon the commanded low group tone frequency and has the logic function

STEP INCREMENT L =

Figure 2:
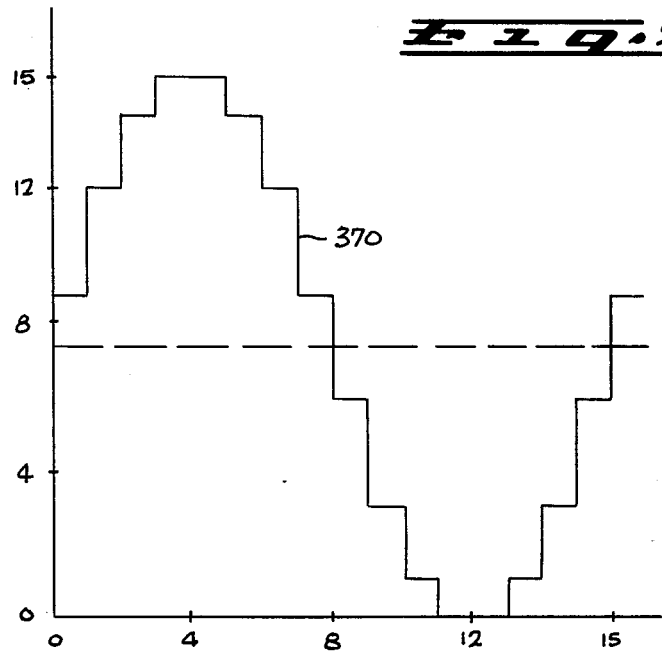
FIG. 2 is an illustration of a waveform synthesized by the synthesizer shown in FIG. 1.

$TCL1 \cdot \bar{\phi}2 \cdot (Q1 \cdot \overline{Q2} \cdot Q3 \cdot Q4 \cdot Q5 \cdot Q6 +$ $+ Q1 \cdot Q2 \cdot \overline{Q3} \cdot Q4 \cdot \overline{Q5} \cdot \overline{Q6}$ $+ Q1 \cdot \overline{Q2} \cdot Q3 \cdot \overline{Q4} \cdot Q5 \cdot Q6$ $+ Q1 \cdot \overline{Q2} \cdot \overline{Q3} \cdot \overline{Q4} \cdot \overline{Q5} \cdot Q6) +$ $TCL2 \cdot \bar{\phi}2 \cdot (Q1 \cdot \overline{Q2} \cdot Q3 \cdot \overline{Q4} \cdot Q5 \cdot \overline{Q6}$ $+ \overline{Q1} \cdot Q2 \cdot Q3 \cdot \overline{Q4} \cdot Q5 \cdot \overline{Q6}$ $+ Q1 \cdot Q2 \cdot \overline{Q3} \cdot Q4 \cdot \overline{Q5} \cdot \overline{Q6}$ $+ \overline{Q1} \cdot Q2 \cdot \overline{Q3} \cdot Q4 \cdot Q5 \cdot \overline{Q6} +$ $TCL3 \cdot \phi 2 \cdot (\overline{Q1} \cdot \overline{Q2} \cdot Q3 \cdot \overline{Q4} \cdot Q5 \cdot \overline{Q6}$ $+ \overline{Q1} \cdot Q2 \cdot Q3 \cdot \overline{Q4} \cdot Q5 \cdot \overline{Q6}$ $+ \overline{Q1} \cdot Q2 \cdot Q3 \cdot Q4 \cdot \overline{Q5} \cdot \overline{Q6}$ $+ Q1 \cdot \overline{Q2} \cdot Q3 \cdot \overline{Q4} \cdot Q5 \cdot \overline{Q6}) +$ $TCL4 \cdot \phi 2 \cdot (\overline{Q1} \cdot \overline{Q2} \cdot Q3 \cdot \overline{Q4} \cdot Q5 \cdot \overline{Q6}$ $+ \overline{Q1} \cdot Q2 \cdot \overline{Q3} \cdot Q4 \cdot \overline{Q5} \cdot \overline{Q6}$ $+ Q1 \cdot \overline{Q2} \cdot Q3 \cdot \overline{Q4} \cdot Q5 \cdot \overline{Q6}$ $+ Q1 \cdot Q2 \cdot \overline{Q3} \cdot Q4 \cdot \overline{Q5} \cdot \overline{Q6})$ Four bit binary counter 342 is incremented for each pulse on signal STEP INCREMENT L and repeatedly cycles through 16 count states, 0–15, as indicated on the horizontal axis for synthesized sine wave signal waveform 370 as shown in FIG. 2. Code translator 344 responds to 4 bit count signals from binary counter 342 to provide a 4 bit binary coded output signal that indicates a desired instantaneous magnitude for the synthesized sine wave signal waveform 370 for each count state. For example, code translator 344 provides a digital output of 9 for count states 0 and 7, an output of 12 for count states 1 and 6, an output of 14 for count states 3 and 5, and an output of 15 for count states 3 and 4. The remaining portion of the sine wave output signal waveform 370 is a mirror image of the first portion with code translator 344 providing a digital output of 6 for count states 8 and 15, 3 for count states 9 and 14, 1 for count states 10 and 13, and 0 for count states 11 and 12. It will be appreciated that by changing the correlation between count state inputs and magnitude outputs for code translator 344, any desired periodic waveform may be generated and synthesizer 330 need not be limited to the generation of sine waves. The 16 varying magnitude steps of the waveform 370 thus occur in sequence in response to successive cycles of signal STEP INCREMENT L. However, because 4 cycles of SIGNAL STEP INCREMENT L occur for eacy cycle of recycling counter 336, signal STEP INCREMENT L is truly periodic only at an intermediate frequency having a period defined by 4 successive cycles of signal STEP INCREMENT L.

Programmable counter 350 operates in a manner similar to programmble counter 336 except that different intermediate frequencies are utilized to provide the different high tone group of DTMF output signals and clock signal step increment H is generated in response to different count states. The D1 input to shift register 352 has the logical function.

HIGH GROUP $D1 = \overline{Q1} \cdot Q2 \cdot Q3 \cdot \overline{Q4} \cdot \overline{Q5} \cdot \overline{Q6} +$ $TCH4 \cdot Q1 \cdot Q2 \cdot \overline{Q3} \cdot \overline{Q4} \cdot \overline{Q5} \cdot \overline{Q6} +$ $TCH1 \cdot \overline{Q1} \cdot Q2 \cdot \overline{Q3} \cdot Q4 \cdot Q5 \cdot Q6 +$ $\overline{TCH3 \cdot \overline{Q1} \cdot \overline{Q2} \cdot Q3 \cdot \overline{Q4} \cdot \overline{Q5} \cdot Q6}$ $\overline{TCH2 \cdot \overline{Q1} \cdot \overline{Q2} \cdot Q3 \cdot Q4 \cdot Q5 \cdot \overline{Q6} \cdot Q5 \cdot Q6 \cdot \overline{Q5} \cdot \overline{Q6}}$ This provides count sequence states of M = 26 for 1638 Hz tone H4, 29 for 1468 Hz tone H3, 32 for 1330 Hz tone H2 and 35 for 1217 Hz tone H1.

Similarly, the clock signal, STEP INCREMENT H, is periodic at an intermediate frequency requiring 4 cycles thereof and has the function

STEP INCREMENT H =

$TCH1 \cdot \bar{\phi}2 \cdot (\overline{Q1} \cdot \overline{Q2} \cdot Q3 \cdot \overline{Q4} \cdot Q5 \cdot \overline{Q6}$ $+ Q1 \cdot \overline{Q2} \cdot Q3 \cdot \overline{Q4} \cdot Q5 \cdot \overline{Q6}$ $+ \overline{Q1} \cdot Q2 \cdot \overline{Q3} \cdot Q4 \cdot Q5 \cdot Q6$ $+ \overline{Q1} \cdot Q2 \cdot Q3 \cdot Q4 \cdot Q5 \cdot \overline{Q6}) +$ $TCH2 \cdot \bar{\phi}2 \cdot (\overline{Q1} \cdot \overline{Q2} \cdot Q3 \cdot Q4 \cdot Q5 \cdot \overline{Q6}$ $+ Q1 \cdot \overline{Q2} \cdot Q3 \cdot \overline{Q4} \cdot Q5 \cdot \overline{Q6}$ $+ Q1 \cdot \overline{Q2} \cdot Q3 \cdot Q4 \cdot Q5 \cdot Q6$ $+ \overline{Q1} \cdot \overline{Q2} \cdot Q3 \cdot Q4 \cdot Q5 \cdot \overline{Q6})$ $TCH3 \cdot \bar{\phi}2 \cdot (Q1 \cdot \overline{Q2} \cdot Q3 \cdot \overline{Q4} \cdot Q5 \cdot Q6$ $+ Q1 \cdot Q2 \cdot Q3 \cdot \overline{Q4} \cdot \overline{Q5} \cdot Q6$ $+ Q1 \cdot \overline{Q2} \cdot \overline{Q3} \cdot Q4 \cdot Q5 \cdot \overline{Q6}$ $+ \overline{Q1} \cdot \overline{Q2} \cdot Q3 \cdot \overline{Q4} \cdot \overline{Q5} \cdot Q6) +$ $TCH4 \cdot \bar{\phi}2 \cdot (Q1 \cdot \overline{Q2} \cdot Q3 \cdot \overline{Q4} \cdot \overline{Q5} \cdot Q6$ $+ Q1 \cdot \overline{Q2} \cdot Q3 \cdot \overline{Q4} \cdot Q5 \cdot Q6$ $Q1 \cdot Q2 \cdot Q3 \cdot Q4 \cdot \overline{Q5} \cdot \overline{Q6}$ $\overline{Q1} \cdot Q2 \cdot \overline{Q3} \cdot Q4 \cdot \overline{Q5} \cdot Q6)$ While there has been shown and described above a waveform synthesizer in accordance with the invention for the purpose of enabling a person of ordinary skill in the art to make and use the invention, it will be appreciated that the invention is not limited thereto. Accordingly, any modifications, variations, or equivalent arrangements within the scope of the attached claims should be considered to be within the scope of the invention.

What is claimed is:

1. A digital waveform synthesizer repetitively generating a waveform at a desired frequency with each cycle of the waveform being generated as N discrete steps, the synthesizer comprising:
a clock generator generating a reference signal at a known frequency;
a frequency divider circuit coupled to repetitively cycle by counting M cycles of the reference signal where M is an integral number that remains constant for a given desired frequency;
a decoder coupled to define discrete parts by dividing each cycle of the frequency divider into an integral number of discrete parts and generate a step increment signal for each discrete part, each discrete part corresponding to one of N steps of the synthesized waveform with at least one of the discrete parts having a time duration different than at least one other discrete part during each cycle of the frequency divider; and
a waveform generator providing a sequence of N discrete waveform signals defining the synthesized waveform; the waveform generator being coupled to be incremented in response to the step increment signal for each discrete part provided by the decoder.

2. The waveform synthesizer according to claim 1 above, further comprising a digital-to-analog converter coupled to receive the discrete waveform signals from the waveform generator and for each discrete waveform signal generate an analog signal having a magnitude corresponding thereto.

3. The waveform synthesizer according to claim 1 above, wherein the waveform generator includes an N count recycling counter connected to be incremented by the step increment signal once for each discrete part, and a code translator coupled to provide the N discrete waveform signals in response to the N counts of the recycling counter respectively, each discrete waveform signal being a multibit digitally coded signal indicating a waveform magnitude during a discrete part.

4. The waveform synthesizer according to claim 1 above, wherein the frequency divider includes a shift register and a feedback matrix coupled to cause the contents of the shift register to sequence through a count cycle of M counts.

5. The waveform synthesizer according to claim 4 above, wherein the feedback matrix is responsive to at least one input signal and changeably selects the number of counts M in each count cycle in response to the at least one input signal.

6. A digital waveform synthesizer comprising:
a clock generator connected to generate a reference signal at a known frequency;
a frequency divider connected to receive the reference signal and provide in response thereto a step increment signal that is periodic at an intermediate frequency greater than the frequency of a synthesized output waveform and having a period extending over a plurality of cycles of the step increment signal with at leat two cycles of different duration of the step increment signal occurring during each period of the step increment signal for at least one of the intermediate frequencies;
a waveform signal generator coupled to generate a synthesized output waveform as a sequence of discrete steps which are advanced in synchronism with the cycles of the step increment signal.

7. The waveform synthesizer according to claim 6 above, wherein the frequency divider is a counter connected to recycle after counting a discrete number of cycles of the reference signal determined by the at least one frequency selection signal.

8. The waveform synthesizer according to claim 7 above, wherein the increment signals are generated in response to selected count states of said counter, the number of count states in each count cycle being a nonintegral multiple of the number of step increment signals for each count cycle at said at least one of the intermediate frequencies.

9. The waveform synthesizer according to claim 8 above, wherein the waveform signal generator includes a recycling second counter coupled to be incremented in response to each step increment signal, a code translator coupled to provide a sequence of discrete output signals in response to the count states of the second counter, the discrete output signals defining one period of a synthesized waveform during each recycling period of the second counter, and further comprising a digital-to-analog converter coupled to provide analog output signals corresponding in magnitude to the discrete output signals.

10. The waveform synthesizer according to claim 9 above, wherein the second counter is a 16 state counter and the waveform synthesizer synthesizes a sinusoidal waveform in 16 discrete steps.

11. The waveform synthesizer according to claim 10 above, wherein 4 cycles of the step increment signal are generated during each cycle of the first mentioned counter.

12. The waveform synthesizer according to claim 6 above, wherein the at least one frequency selection signal includes 4 mutually exclusive low tone selection signals.

13. The waveform synthesizer according to claim 12 above, wherein the integral number submultiples of the reference signal frequency provided by the frequency divider include 45, 50, 55 and 61, each being operative in response to a different low tone selection signal, and wherein the reference signal has a frequency of 170.3 KHz.

14. The waveform synthesizer according to claim 12 above, wherein the integral number submultiples of the reference signal frequency provided by the frequency divider include 26, 29, 32 and 35, each being operative in response to a different high tone selection signal, and wherein the reference signal has a frequency of 170.3 KHz.

15. The waveform synthesizer according to claim 13 above, wherein an integral number plurality of cycles of the intermediate frequency signal occurs for each cycle of the synthesized waveform.

16. The waveform synthesizer according to claim 15 above, wherein a sinusoidal waveform is generated in 16 steps being provided for each cycle of the intermediate frequency signal.

17. The waveform synthesizer according to claim 13 above, wherein one of the synthesized waveforms approximates a sinusoidal frequency of 774 Hz for a DTMF tone signal with the integral number submultiple being 55 and with 4 step increment signals being provided for each cycle of the intermediate frequency signal and with 4 cycles of the intermediate signal occurring for each cycle of the synthesized waveform.

18. The waveform synthesizer according to claim 17 above, wherein the frequency divider is a recycling counter with 45 count states and wherein during each cycle of the recycling counter three stepping signals are each generated after 11 count states and one stepping signal is generated after 12 count states.

* * * * *

UNITED STATES PATENT AND TRADEMARK OFFICE
CERTIFICATE OF CORRECTION

PATENT NO. : 4,068,178

DATED : January 10, 1978

INVENTOR(S) : Burton Ralph Tunzi

It is certified that error appears in the above-identified patent and that said Letters Patent are hereby corrected as shown below:

Column 1, line 12, "relation" should read --related--. Column 2, line 32, between "frequency)" and "to cause", delete "at output LOGP tone frequency" and substitute --tone frequency at output LO GP--. Column 3, line 13, after "of" and before "N", "step" should read --steps--. Column 6, line 4, "eacy" should read --each--; line 10, "programmble" should read --programmable--. Column 7, line 65, after "at" and before "to", "leat" should read --least--. Column 8, line 11, after "the" and before "increment" insert --step--; line 61, after "16 steps" insert --during 4 cycles of the intermediate frequency signal with 4 steps--.

Signed and Sealed this

Second Day of May 1978

[SEAL]

Attest:

RUTH C. MASON
Attesting Officer

LUTRELLE F. PARKER
Acting Commissioner of Patents and Trademarks